United States Patent
Fosnight et al.

(10) Patent No.: US 9,564,350 B1
(45) Date of Patent: Feb. 7, 2017

(54) METHOD AND APPARATUS FOR STORING AND TRANSPORTING SEMICONDUCTOR WAFERS IN A VACUUM POD

(71) Applicant: GLOBALFOUNDRIES Inc., Grand Cayman (KY)

(72) Inventors: William Fosnight, Saratoga Spring, NY (US); Stephanie Waite, Glens Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/858,475

(22) Filed: Sep. 18, 2015

(51) Int. Cl.
  *H01L 21/67* (2006.01)
  *H01L 21/677* (2006.01)
  *B25J 11/00* (2006.01)

(52) U.S. Cl.
  CPC ...... *H01L 21/67766* (2013.01); *B25J 11/0095* (2013.01)

(58) Field of Classification Search
  CPC ............ H01L 21/67742; H01L 21/67775; H01L 21/67763
  USPC ........................................................ 414/217
  See application file for complete search history.

(56) References Cited

U.S. PATENT DOCUMENTS

| | | | | |
|---|---|---|---|---|
| 4,724,874 A | * | 2/1988 | Parikh | H01L 21/67393 141/383 |
| 5,139,459 A | * | 8/1992 | Takahashi | H01L 21/67126 118/719 |
| 5,364,219 A | * | 11/1994 | Takahashi | H01L 21/67724 118/719 |
| 5,462,397 A | * | 10/1995 | Iwabuchi | H01L 21/67757 118/719 |
| 5,586,585 A | * | 12/1996 | Bonora | H01L 21/67772 141/1 |
| 5,628,683 A | * | 5/1997 | Gentischer | B01L 1/04 414/217 |
| 5,695,564 A | * | 12/1997 | Imahashi | C23C 14/568 118/719 |
| 5,697,748 A | * | 12/1997 | Somekh | H01L 21/67739 414/217 |
| 5,697,749 A | * | 12/1997 | Iwabuchi | H01L 21/67781 118/719 |

(Continued)

*Primary Examiner* — Kaitlin Joerger
(74) *Attorney, Agent, or Firm* — Ditthavong & Steiner, P.C.

(57) ABSTRACT

Methodology and system for using vacuum pods to store/transport semiconductor wafers to efficiently reduce contamination of the wafers while reducing cost, cycle time, and process steps and tools without the need for a complete reconfiguration of processes/tools in the fabrication facility are disclosed. Embodiments include configuring a wafer pod with an isolated vacuum environment for storing and transporting semiconductor wafers; configuring a load port module with an isolated vacuum environment to interface with the wafer pod; transporting the wafer pod, including semiconductor wafers, to interlock with the load port module; creating a merged vacuum environment including the isolated vacuum environments of the wafer pod and the load port module; increasing a pressure level in the merged vacuum environment for creating a merged ambient atmospheric environment; and transferring the semiconductor wafers through a transfer chamber, with an isolated environment, from the load port module to a semiconductor wafer processing device.

20 Claims, 5 Drawing Sheets

(56) References Cited

U.S. PATENT DOCUMENTS

| | | | | |
|---|---|---|---|---|
| 5,730,573 | A * | 3/1998 | Masujima | H01L 21/67772 414/217 |
| 5,984,610 | A * | 11/1999 | Rush | H01L 21/67775 414/217 |
| 6,048,154 | A * | 4/2000 | Wytman | H01L 21/67748 414/217 |
| 6,082,948 | A * | 7/2000 | Fishkin | H01L 21/67757 414/217 |
| 6,152,669 | A * | 11/2000 | Morita | H01L 21/67772 414/217 |
| 6,176,667 | B1 * | 1/2001 | Fairbairn | H01L 21/67017 414/217 |
| 6,338,604 | B1 * | 1/2002 | Okabe | H01L 21/67373 414/217 |
| 6,428,262 | B1 * | 8/2002 | Vanderpot | H01L 21/67745 414/217 |
| 6,537,011 | B1 * | 3/2003 | Wang | H01L 21/68707 118/728 |
| 6,540,465 | B2 * | 4/2003 | Tometsuka | C23C 16/54 414/160 |
| 6,641,349 | B1 * | 11/2003 | Miyajima | H01L 21/67126 206/711 |
| 7,198,447 | B2 * | 4/2007 | Morimitsu | H01L 21/67757 414/217 |
| 8,303,231 | B2 * | 11/2012 | Yu | H01L 21/67772 414/217 |
| 8,562,271 | B2 * | 10/2013 | Hofmeister | H01L 21/6719 414/217 |
| 8,950,999 | B2 * | 2/2015 | Tamura | H01L 21/67248 414/217 |
| 2004/0126206 | A1 * | 7/2004 | Araya | H01L 21/67781 414/217 |
| 2004/0234359 | A1 * | 11/2004 | Mitchell | H01L 21/67213 414/217 |
| 2006/0285944 | A1 * | 12/2006 | Evans | H01L 21/67781 414/217 |
| 2008/0080963 | A1 | 4/2008 | Bufano et al. | |
| 2010/0014945 | A1 * | 1/2010 | Takizawa | H01L 21/67167 414/217 |
| 2015/0063955 | A1 * | 3/2015 | Miki | H01L 21/67772 414/217 |
| 2015/0133044 | A1 * | 5/2015 | Kumagai | H01L 21/67109 454/284 |
| 2015/0170945 | A1 * | 6/2015 | Segawa | H01L 21/67017 414/217 |
| 2016/0079100 | A1 * | 3/2016 | Gould | H01L 21/67201 438/689 |

* cited by examiner

Background

Background

Background

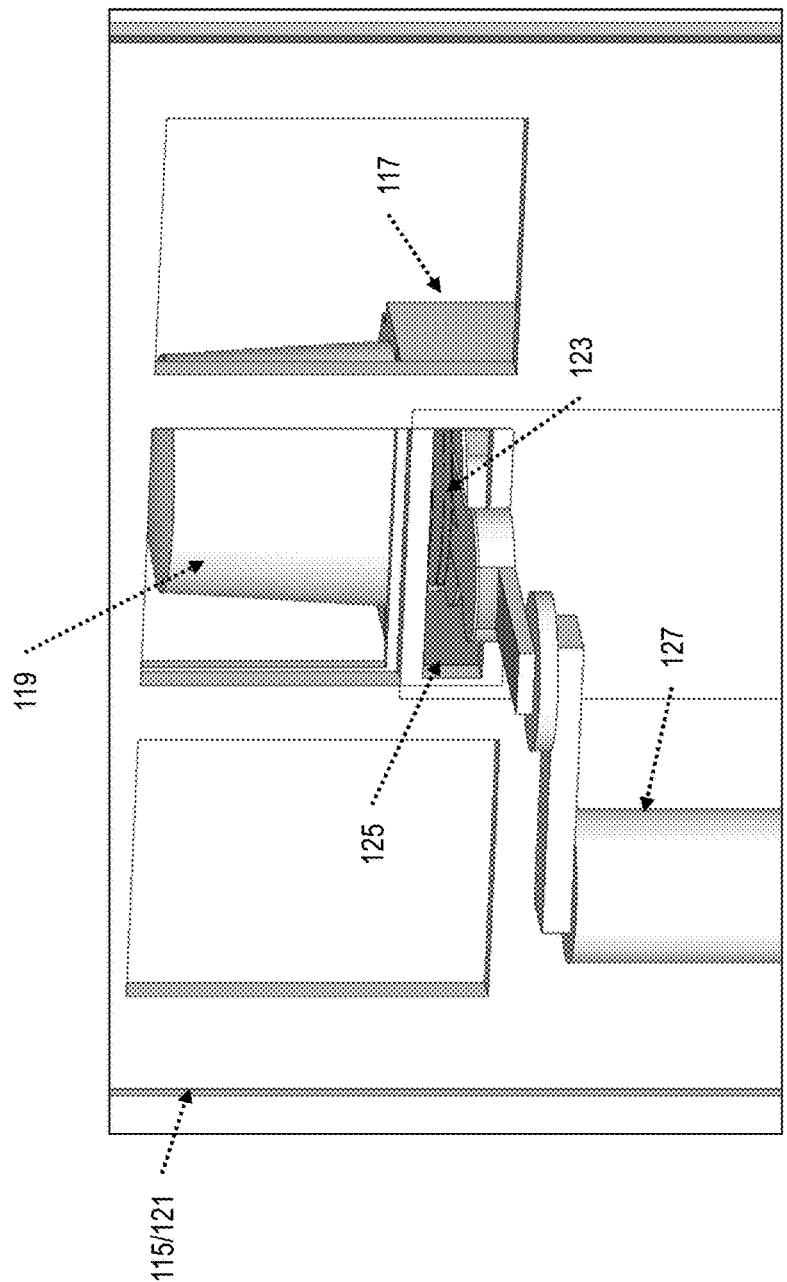

METHOD AND APPARATUS FOR STORING AND TRANSPORTING SEMICONDUCTOR WAFERS IN A VACUUM POD

TECHNICAL FIELD

The present disclosure relates generally to designing and fabricating integrated circuit (IC) devices. The present disclosure is particularly applicable to storing and transporting semiconductor wafers in a semiconductor fabrication facility.

BACKGROUND

Generally, to increase efficiency of an IC fabrication facility, semiconductor manufacturers seek to reduce the number of processes and apparatus that are utilized in the fabrication facility, or maximize their efficiency. In some instances, the size of an apparatus may be reduced to allow for a more compact facility layout or for additional apparatus in the same layout. Semiconductor fabrication facilities utilize various processes and apparatus in fabricating IC devices on semiconductor wafers, which may be stored and transported, from one processing station/apparatus to a next one. While the wafers are stored or transported, they may be subjected to direct or wafer-to-wafer airborne molecular contamination (AMC) or moisture causing failures during subsequent fabrication processes. In some instances, additional processes and an inert gas (e.g., nitrogen ($N_2$)) may be utilized to overcome some of the contamination/moisture issues.

FIG. 1A illustrates an example wafer processing system that includes a wafer processing apparatus 101 interfacing with an equipment front-end module (EFEM) 103 (e.g., a transfer chamber), which interfaces with load ports (LP) 105. A front opening unified pod (FOUP) 107 may be used to store wafers as well as to dock at a LP 105 for delivering wafers to the processing apparatus 101. However, prior to or post processing of the wafers, they may be contaminated by AMC or moisture (e.g., directly or wafer-to-wafer) as the wafers are transferred and stored in the FOUP 107. Additionally, the material (e.g., plastic) of a FOUP 107 may absorb contaminants and later disperse them in the pod environment causing contamination of the wafers.

FIG. 1B illustrates another example wafer processing system where LPs 109 may be purged by using a suitable purging agent (e.g., $N_2$), which may reduce AMCs and moisture in the FOUP 107 during storage and transportation of the wafers. However, this approach would require new LPs 109 with a high consumption of purging agent, purging of the FOUP in storage to maintain the FOUP environment, and frequent cleaning of the FOUPs. Additionally, although the LPs 109 and FOUPs 107 may have a purged atmosphere, the EFEM 103 does not and may still cause contamination of the wafers as they are transferred from and to the LPs 109.

FIG. 1C illustrates another example wafer processing system where wafer pods 111 interface with LPs 113, which directly interface with the processing apparatus 101. This configuration requires significant tool reconfiguration; for example, replacing load locks, modifying system software, and a faster automated material handling system (AMHS).

A need therefore exists for a methodology and system to efficiently reduce contamination of semiconductor wafers during storage and transportation of the wafers while reducing cost, cycle time and process steps and tools.

SUMMARY

An aspect of the present disclosure is a method for using vacuum pods to store and transport semiconductor wafers to efficiently reduce contamination of the wafers while reducing cost, cycle time, and process steps and tools without the need for a complete reconfiguration of processes and tools in the fabrication facility.

Another aspect of the present disclosure is a system using vacuum pods to store and transport semiconductor wafers to efficiently reduce contamination of the wafers while reducing cost, cycle time, and process steps and tools without the need for a complete reconfiguration of processes and tools in the fabrication facility.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including configuring a wafer pod with an isolated vacuum environment for storing and transporting semiconductor wafers; configuring a load port module with an isolated vacuum environment to interface with the wafer pod; transporting the wafer pod, including semiconductor wafers, to interlock with the load port module; creating a merged vacuum environment including the isolated vacuum environments of the wafer pod and the load port module; increasing a pressure level in the merged vacuum environment for creating a merged ambient atmospheric environment; and transferring the semiconductor wafers through a transfer chamber, with an isolated environment, from the load port module to a semiconductor wafer processing device.

In one aspect, the wafer pod interfaces with the load port module at a lower surface of the wafer pod and an upper surface of the load port module.

Another aspect includes providing nitrogen for creating the merged ambient atmospheric environment. A further aspect includes, subsequent to creating the merged vacuum environment in the merged environment, transferring the semiconductor wafers from the wafer pod to the load port module.

Some aspects include transferring processed semiconductor wafers, through the transfer chamber, from the semiconductor wafer processing device to the load port module; closing a valve between the load port module and the transfer chamber; and decreasing the pressure level in the merged ambient atmospheric environment to recreate a merged vacuum environment. An additional aspect includes closing a door between the wafer pod and the load port module to recreate an isolated vacuum environment in the wafer pod. Another aspect includes indexing the semiconductor wafers in the load port module.

In one aspect, the isolated environment of the transfer chamber is a vacuum, an air atmosphere, or a nitrogen atmosphere. In another aspect, a transfer chamber with a vacuum or with a nitrogen atmosphere is smaller in size than a transfer chamber with an air atmosphere.

Another aspect of the present disclosure includes a system including: a wafer pod with an isolated vacuum environment for storing and transporting semiconductor wafers; a load port module with an isolated vacuum environment to interface with the wafer pod; an apparatus for transporting the wafer pod, including semiconductor wafers, to interlock with the load port module; an apparatus for creating a merged vacuum environment including the isolated vacuum environments of the wafer pod and the load port module; an apparatus for increasing a pressure level in the merged vacuum environment for creating a merged ambient atmospheric environment; and an apparatus for transferring the semiconductor wafers through a transfer chamber, with an isolated environment, from the load port module to a semiconductor wafer processing device.

In another aspect of the system, the wafer pod interfaces with the load port module at a lower surface of the wafer pod and an upper surface of the load port module. In another aspect, the system includes nitrogen in the apparatus for creating the merged atmospheric environment.

One aspect of the system includes an apparatus for transferring the semiconductor wafers from the wafer pod to the load port module subsequent to creating the merged vacuum environment.

A further aspect of the system includes an apparatus for transferring processed semiconductor wafers, through the transfer chamber, from the semiconductor wafer processing device to the load port module; a valve between the load port module and the transfer chamber for creating a merged vacuum environment; and an apparatus for decreasing the pressure level in the merged ambient atmospheric environment to recreate a merged vacuum environment.

Another aspect of the system includes a door between the wafer pod and the load port module for recreating an isolated vacuum in the wafer pod. Another aspect of the system includes an apparatus for indexing the semiconductor wafers in the load port module.

In one aspect of the system, the isolated environment of the transfer chamber is a vacuum, an air atmosphere, or a nitrogen atmosphere. In a further aspect of the system, a transfer chamber with a vacuum or with a nitrogen atmosphere is smaller in size than a transfer chamber with an air atmosphere.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2C illustrate wafer processing systems, in accordance with exemplary embodiments.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of AMC, moisture levels, cycle times, high $N_2$ consumption, and fabrication facility layout attendant upon semiconductor wafer processing. The present disclosure addresses and solves such problems without the need for a complete reconfiguration of processes and tools in the fabrication facility, for instance, by, inter alia, employing vacuum pods for storing and transporting the semiconductor wafers in the fabrication facility. Additionally, the wafer pods and LPs are degassed at every process step eliminating the need for a dedicated pod regenerator tool, which makes available cleanroom space for more critical process tools.

Figures 1A, 1B:
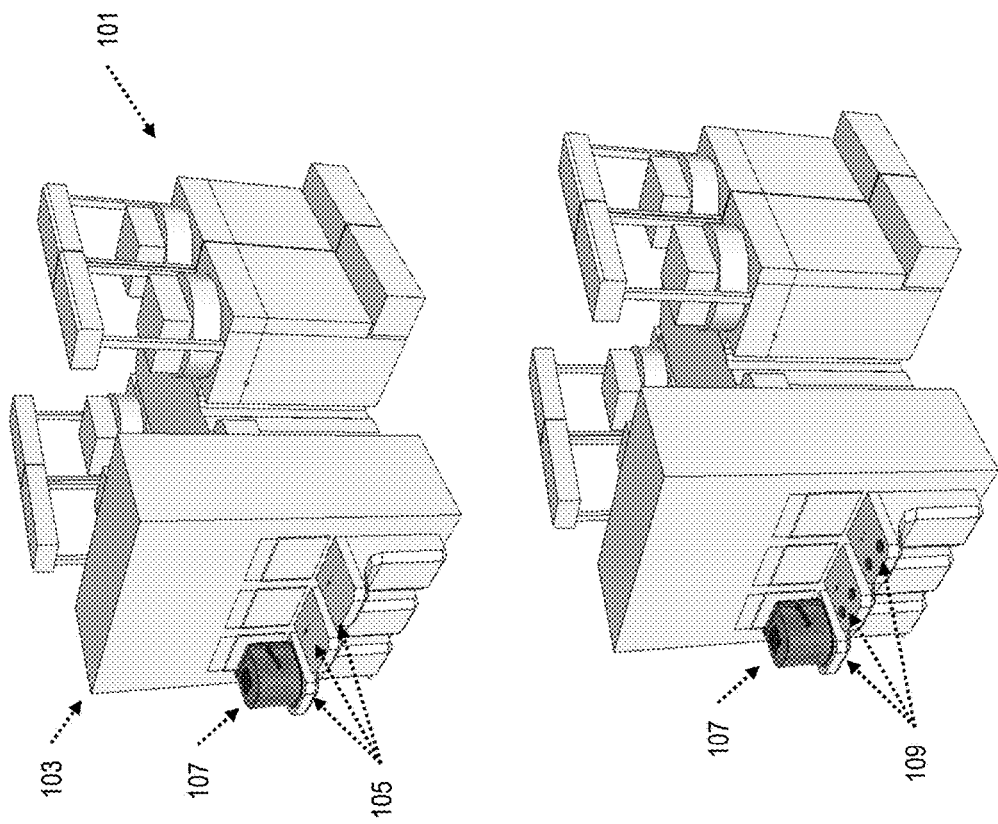
FIGS. 1A through 1C illustrate example wafer processing systems.
Figure 1C:
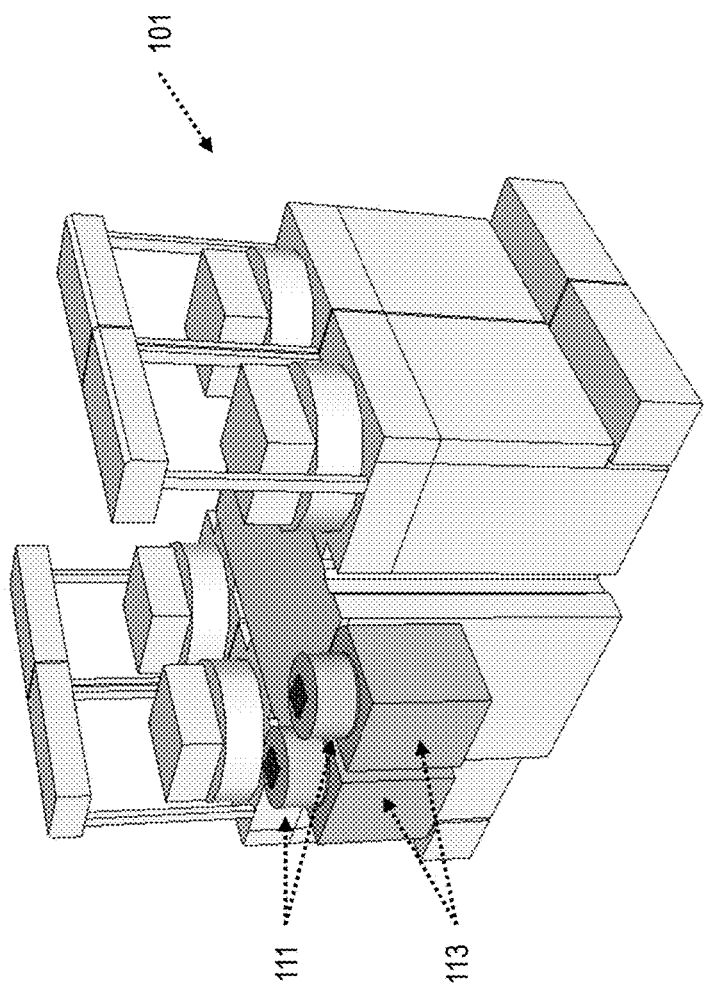
Figure 2A:
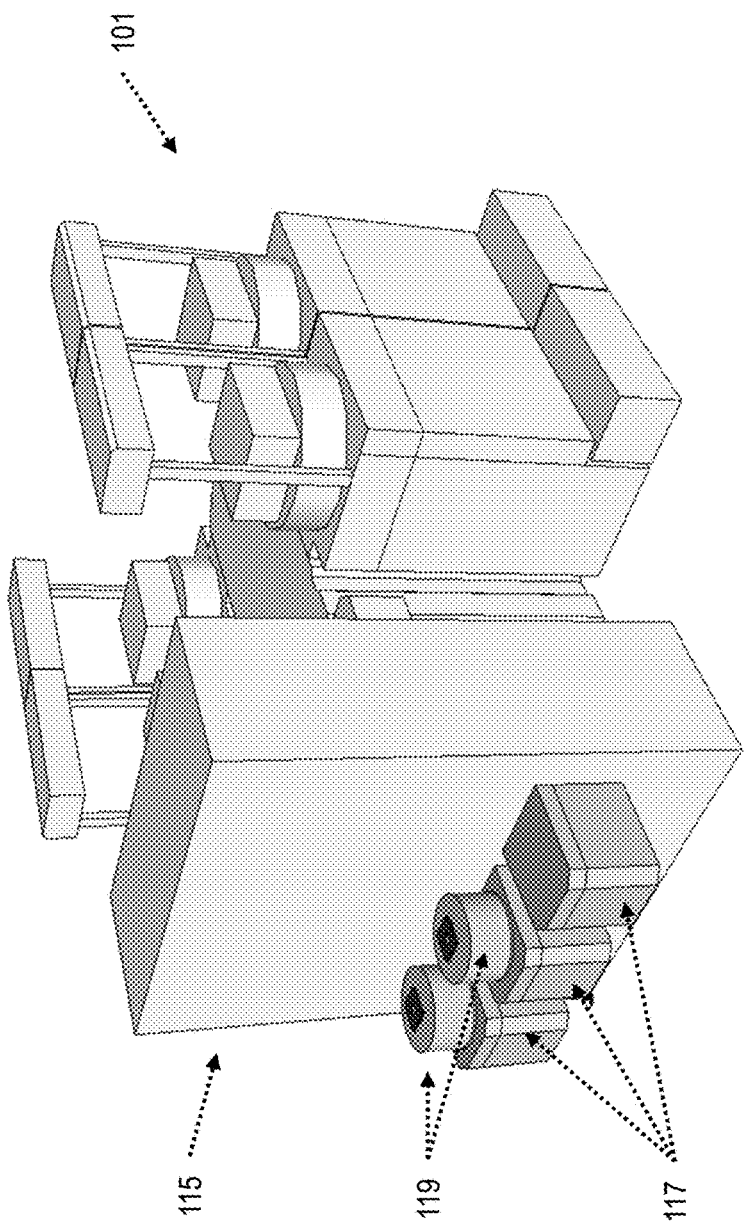

As noted earlier, a semiconductor wafer may be stored, transported and processed at different steps in fabrication of IC devices. FIG. 2A illustrates a wafer processing system in accordance with an exemplary embodiment including a processing apparatus 101, an EFEM 115, LPs 117, and vacuum wafer pods 119. A lower surface of the wafer pod 119 may include an opening interfacing with an opening at an upper surface of an LP 117. Also, the LP 117 may include another opening (e.g., on a side surface) interfacing with an opening at the EFEM 115. The wafer pods 119 may have an isolated vacuum environment for storing wafers or transferring them to an LP 117. The interface between the LPs 117 and the EFEM 115 may be a "box opener-loader tool standard" (BOLTS) interface developed by the Semiconductor Equipment and Materials International (SEMI) organization. BOLTS based LPs 117 may easily interface with already existing process tools.

In one scenario, a wafer pod 119 at vacuum containing some wafers is transported (e.g., by AMHS) to and is docked at an LP 117 that is at vacuum (e.g., at some level of a vacuum environment). Vacuum environment of the LP 117 may need to be pumped down to match that of the wafer pod 119. Once the two vacuum environments are matched, openings/doors of the vacuum wafer pod 119 and LP 117 are opened merging the two vacuum environments. Next, the wafers in the wafer pod 119 are lowered into the LP 117 and the merged vacuum environment is vented with $N_2$ or extra-clean dry air to atmospheric pressure. Once the atmospheric pressure is established, doors between the LP 117 and the EFEM 115 are opened to allow a robot in the EFEM 115 to transfer the wafers to the processing apparatus 101 for processing (e.g., a chemical mechanical polishing). The LP 117 is continuously purged with a low flow rate of $N_2$ (e.g., about 10 standard liters per minute (SLPM)) to maintain the $N_2$ concentration in the LP 117. After processing, the wafers are transferred back to the LP 117 and the doors between the LP 117 and the EFEM 115 are closed so the merged $N_2$ atmosphere in the LP 117 and the wafer pod 119 can be pumped down to create a merged vacuum environment. Once vacuum is reached, the door on the wafer pod 119 is closed to store the wafers in vacuum and transport them (e.g., by AMHS) to a next processing tool/station.

Figure 2B:
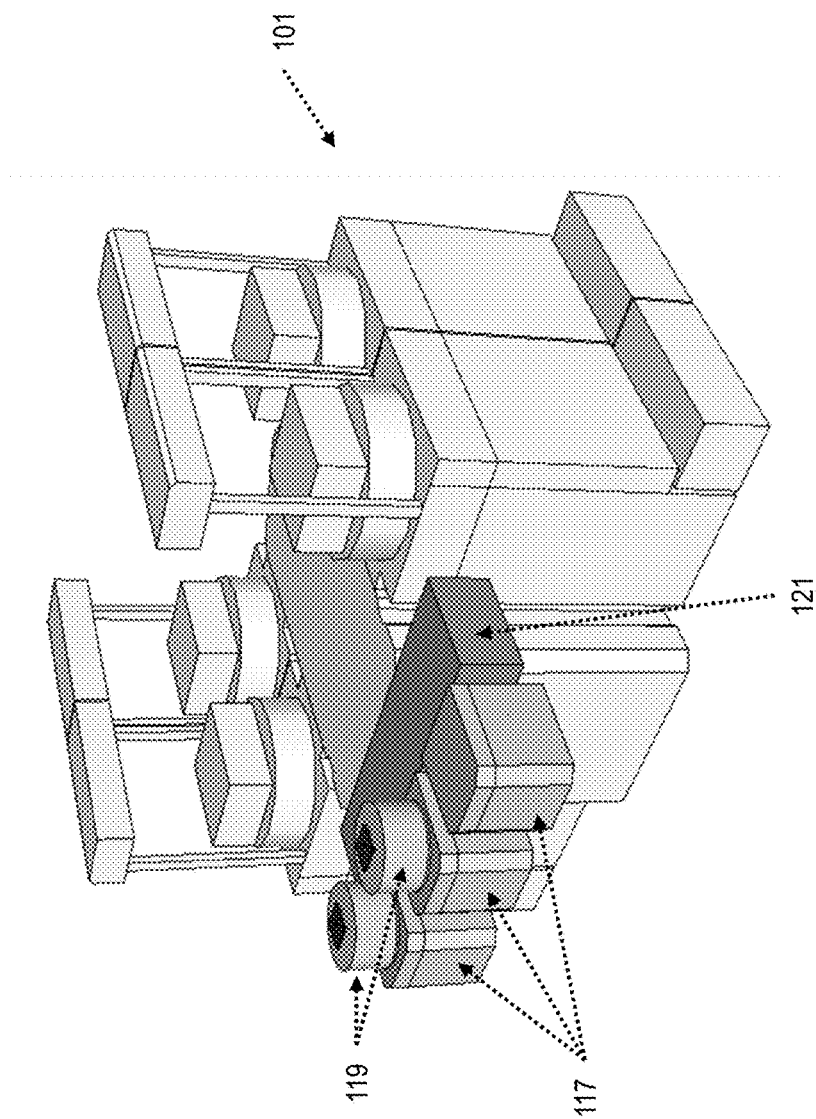

Adverting to FIG. 2B, another configuration in accordance with a second exemplary embodiment is illustrated where the EFEM 115 of FIG. 2A is replaced (e.g., reduced cost/space) by a transfer chamber 121 that may be at vacuum or at an ambient atmospheric pressure with air or $N_2$ environment. A transfer chamber 121 with a vacuum or with a $N_2$ atmosphere may be smaller in size than a transfer chamber with an air atmosphere. In this configuration, lower levels of AMC and moisture may be maintained continuously while the layout of the processing system is reduced (e.g., smaller footprint) for a more compact fabrication facility layout or more space for additional equipment/stations. Furthermore, an LP 117 may index the wafers included therein so that a more compact robot in a smaller transfer chamber 121 may easily access the already indexed wafers.

FIG. 2C is a diagram of an interface between an LP 117 and an EFEM 115 or 121, in accordance with exemplary embodiments. The diagram is a view from inside an EFEM 115/121 illustrating a wafer pod 119 interfacing with an LP 117 for transporting semiconductor wafers 123 to the LP 117. An interface between an LP 117 and an EFEM 115/121 may include an opening 125 (e.g., on a side surface), through which, a robotic arm 127 in the EFEM may transfer the semiconductor wafers 123 from/to the LP 117. The LP 117 may include a mechanism for indexing the semiconductor wafers 123 as the robotic arm 127 transfers them into or out of the LP 117. Also, the robotic arm 127 may include a mechanism to index the semiconductor wafers 123 as it transfers them into or out of the LP 117. In a scenario where an EFEM 121 may be utilized, semiconductor wafers 123 may be indexed in an LP 117 since there may be limited space for indexing movements of a robotic arm 127.

The embodiments of the present disclosure can achieve several technical effects in semiconductor manufacturing including eliminating molecular contamination as a yield detractor, eliminating manufacturing queue time constraints that limit production capacity, reducing process equipment footprint, and lowering cost of manufacturing and $N_2$ consumption. The $N_2$ consumption is reduced by drastically minimizing its use at LPs as well as eliminating the need for the $N_2$ during wafer storage in vacuum wafer pods. Additionally, the vacuum wafer pods and wafers are degassed at every process step, which eliminates the need for a FOUP decontamination process and tool. Reducing the decontamination process eliminates a critical time link as well as a process step, making available cleanroom space for more critical process tools. Two common wafer environment control processes are replaced by simply storing wafers in a vacuum atmosphere. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use static-random-access memory (SRAM) cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
configuring a wafer pod with an isolated vacuum environment for storing and transporting semiconductor wafers;
configuring a load port module with an isolated vacuum environment to interface with the wafer pod;
transporting the wafer pod, including semiconductor wafers, to interlock with the load port module;
creating a merged vacuum environment including the isolated vacuum environments of the wafer pod and the load port module;
increasing a pressure level in the merged vacuum environment for creating a merged ambient atmospheric environment; and
transferring the semiconductor wafers through a transfer chamber, with an isolated environment, from the load port module to a semiconductor wafer processing device,
wherein the transfer chamber is separate and distinct from the load port module.

2. The method according to claim 1, wherein the wafer pod interfaces with the load port module at a lower surface of the wafer pod and an upper surface of the load port module.

3. The method according to claim 1, further comprising:
providing nitrogen for creating the merged ambient atmospheric environment.

4. The method according to claim 1, further comprising:
subsequent to creating the merged vacuum environment, transferring the semiconductor wafers from the wafer pod to the load port module.

5. The method according to claim 1, further comprising:
transferring processed semiconductor wafers, through the transfer chamber, from the semiconductor wafer processing device to the load port module;
closing a valve between the load port module and the transfer chamber; and
decreasing the pressure level in the merged ambient atmospheric environment to recreate a merged vacuum environment.

6. The method according to claim 5, further comprising:
closing a door between the wafer pod and the load port module to recreate an isolated vacuum environment in the wafer pod.

7. The method according to claim 1, further comprising:
indexing the semiconductor wafers in the load port module.

8. The method according to claim 1, wherein the isolated environment of the transfer chamber is a vacuum, an air atmosphere, or a nitrogen atmosphere.

9. The method according to claim 8, wherein a transfer chamber with a vacuum or with a nitrogen atmosphere is smaller in size than a transfer chamber with an air atmosphere.

10. A system comprising:
a wafer pod with an isolated vacuum environment for storing and transporting semiconductor wafers;
a load port module with an isolated vacuum environment to interface with the wafer pod;
an apparatus for transporting the wafer pod, including semiconductor wafers, to interlock with the load port module;
an apparatus for creating a merged vacuum environment including the isolated vacuum environments of the wafer pod and the load port module;

an apparatus for increasing a pressure level in the merged vacuum environment for creating a merged ambient atmospheric environment; and an apparatus for transferring the semiconductor wafers through a transfer chamber, with an isolated environment, from the load port module to a semiconductor wafer processing device, wherein the transfer chamber is separate and distinct from the load port module.

11. The system according to claim 10, wherein the wafer pod interfaces with the load port module at a lower surface of the wafer pod and an upper surface of the load port module.

12. The system according to claim 10, comprising nitrogen in the apparatus for creating the merged ambient atmospheric environment.

13. The system according to claim 10, further comprising:
an apparatus for transferring the semiconductor wafers from the wafer pod to the load port module subsequent to creating the merged vacuum environment.

14. The system according to claim 10, further comprising:
an apparatus for transferring processed semiconductor wafers, through the transfer chamber, from the semiconductor wafer processing device to the load port module;

a valve between the load port module and the transfer chamber for creating a merged vacuum environment; and an apparatus for decreasing the pressure level in the merged ambient atmospheric environment to recreate a merged vacuum environment.

15. The system according to claim 14, further comprising:
a door between the wafer pod and the load port module for recreating an isolated vacuum environment in the wafer pod.

16. The system according to claim 10, further comprising:
an apparatus for indexing the semiconductor wafers in the load port module.

17. The system according to claim 10, wherein the isolated environment of the transfer chamber is a vacuum, an air atmosphere, or a nitrogen atmosphere.

18. The system according to claim 17, wherein a transfer chamber with a vacuum or with a nitrogen atmosphere is smaller in size than a transfer chamber with an air atmosphere.

19. A method comprising:
configuring a wafer pod with an isolated vacuum environment for storing and transporting semiconductor wafers;

configuring a load port module with an isolated vacuum environment to interface with the wafer pod at a lower surface of the wafer pod and an upper surface of the load port module;

transporting the wafer pod, including semiconductor wafers, to interlock with the load port module;

creating a merged vacuum environment including the isolated vacuum environments of the wafer pod and the load port module;

transferring the semiconductor wafers from the wafer pod to the load port module;

increasing a pressure level including nitrogen in the merged vacuum environment for creating a merged ambient atmospheric environment; and transferring the semiconductor wafers through a transfer chamber, with an isolated atmosphere, from the load port module to a semiconductor wafer processing device, wherein the transfer chamber is separate and distinct from the load port module.

20. The method according to claim 19, further comprising:
transferring processed semiconductor wafers, through the transfer chamber, from the semiconductor wafer processing device to the load port module;

closing a valve between the load port module and the transfer chamber; and decreasing the pressure level in the merged ambient atmospheric environment to recreate a merged vacuum environment.

* * * * *